US010348260B2

United States Patent
Oishi

(10) Patent No.: US 10,348,260 B2
(45) Date of Patent: Jul. 9, 2019

(54) AMPLIFIER CIRCUIT AND FILTER

(71) Applicant: FUJITSU LIMITED, Kawasaki-shi, Kanagawa (JP)

(72) Inventor: Kazuaki Oishi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/100,271

(22) Filed: Aug. 10, 2018

(65) Prior Publication Data

US 2019/0068148 A1    Feb. 28, 2019

(30) Foreign Application Priority Data

Aug. 22, 2017   (JP) .................. 2017-159643

(51) Int. Cl.
*H03G 1/00* (2006.01)
*H03F 1/32* (2006.01)
*H03F 3/45* (2006.01)

(52) U.S. Cl.
CPC ......... *H03G 1/0029* (2013.01); *H03F 1/3211* (2013.01); *H03F 3/45179* (2013.01); *H03F 2200/171* (2013.01); *H03F 2203/45* (2013.01)

(58) Field of Classification Search
CPC ............... H03F 3/45179; H03F 1/3211; H03F 2200/171
USPC ....................................................... 327/103
See application file for complete search history.

(56) References Cited

U.S. PATENT DOCUMENTS

| 5,990,741 A * | 11/1999 | Yamamoto ............ H03F 1/3211 330/253 |
| 2007/0146064 A1 | 6/2007 | Morie et al. |
| 2013/0009699 A1 * | 1/2013 | Oishi .................. H03F 3/45475 327/553 |

FOREIGN PATENT DOCUMENTS

| JP | 10-303664 | 11/1998 |
| JP | 2003-152474 | 5/2003 |
| JP | 2007-181032 | 7/2007 |
| JP | 2008-283555 | 11/2008 |

* cited by examiner

*Primary Examiner* — John W Poos
(74) *Attorney, Agent, or Firm* — Fujitsu Patent Center

(57) ABSTRACT

An OTA circuit includes a first input stage that includes a first pair of transistors having sources coupled to a reference potential and converts a differential input voltage input to gates of the first pair of transistors into a first control current, a second input stage that includes a second pair of transistors having sources coupled to the reference potential and converts the differential input voltage input to gates of the second pair of transistors into a second control current, a first output circuit that generates one output current out of the differential output currents in accordance with the first control current, and a second output circuit that generates the other output current out of the differential output currents in accordance with the second control current.

14 Claims, 19 Drawing Sheets

AMPLIFIER CIRCUIT AND FILTER

CROSS-REFERENCE TO RELATED APPLICATION

This application is based upon and claims the benefit of priority of the prior Japanese Patent Application No. 2017-159643, filed on Aug. 22, 2017, the entire contents of which are incorporated herein by reference.

FIELD

The embodiments discussed herein are related to an amplifier circuit and a filter.

BACKGROUND

To date, an operational transconductance amplifier (OTA) circuit is known as an amplifier capable of controlling transconductance (also referred to as "Gm").

FIG. 1 is a diagram illustrating an example of the configuration of the related-art OTA circuit. An OTA circuit 10 includes three N-channel MOSFETs 11, 12, and 13, four current sources 14, 15, 16, and 17, two input terminals 18 and 19, two output terminals 20 and 21, and a control voltage input terminal 22.

In this regard, MOSFET is an abbreviation of metal-oxide-semiconductor field-effect transistor. Hereinafter an N-channel MOSFET is also referred to as an NMOS, and a P-channel MOSFET is also referred to as a PMOS.

The gate of the NMOS 11 is connected to the input terminal 18 applied with an input voltage Vin. The drain of the NMOS 11 is connected to the output terminal 20 from which an output current IoutX is output, and connected to a power source terminal via the current source 14. The source of the NMOS 11 is connected to the source of the NMOS 13 and is grounded via the current source 16.

The gate of the NMOS 12 is connected to the input terminal 19 applied with an input voltage VinX. The drain of the NMOS 12 is connected to the output terminal 21 from which an output current Iout is output, and is connected to the power source terminal via the current source 15. The source of the NMOS 12 is connected to the drain of the NMOS 13 and is grounded via the current source 17. The gate of the NMOS 13 is connected to the control voltage input terminal 22 externally applied with a control voltage Vc.

In the OTA circuit 10, it is possible to control Gm of the OTA circuit 10 by adjusting the magnitude of the control voltage Vc so as to change the resistance value of the NMOS 13.

However, in the configuration in FIG. 1, as a differential input voltage input between the gates of the NMOSs 11 and 12 becomes higher, the drain-to-source voltage of the NMOS 13 changes into a saturation area in which the NMOS 13 is unable to be used as a variable resistor. When the drain-to-source voltage of the NMOS 13 changes into the saturation area, distortions of the output currents output from the drains of the NMOSs 11 and 12 become large as illustrated in FIG. 2. Accordingly, the differential input voltage allowed to input into the OTA circuit is limited to a predetermined voltage range (for example, ±0.2 V).

The followings are reference documents.
[Document 1] Japanese Laid-open Patent Publication No. 10-303664,
[Document 2] Japanese Laid-open Patent Publication No. 2007-181032,
[Document 3] Japanese Laid-open Patent Publication No. 2008-283555, and
[Document 4] Japanese Laid-open Patent Publication No. 2003-152474.

SUMMARY

According to an aspect of the invention, an OTA circuit includes a first input stage that includes a first pair of transistors having sources coupled to a reference potential and converts a differential input voltage input to gates of the first pair of transistors into a first control current, a second input stage that includes a second pair of transistors having sources coupled to the reference potential and converts the differential input voltage input to gates of the second pair of transistors into a second control current, a first output circuit that generates one output current out of the differential output currents in accordance with the first control current, and a second output circuit that generates the other output current out of the differential output currents in accordance with the second control current.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the following, a description will be given of an OTA circuit and a filter according to the present embodiment.

Figure 1:
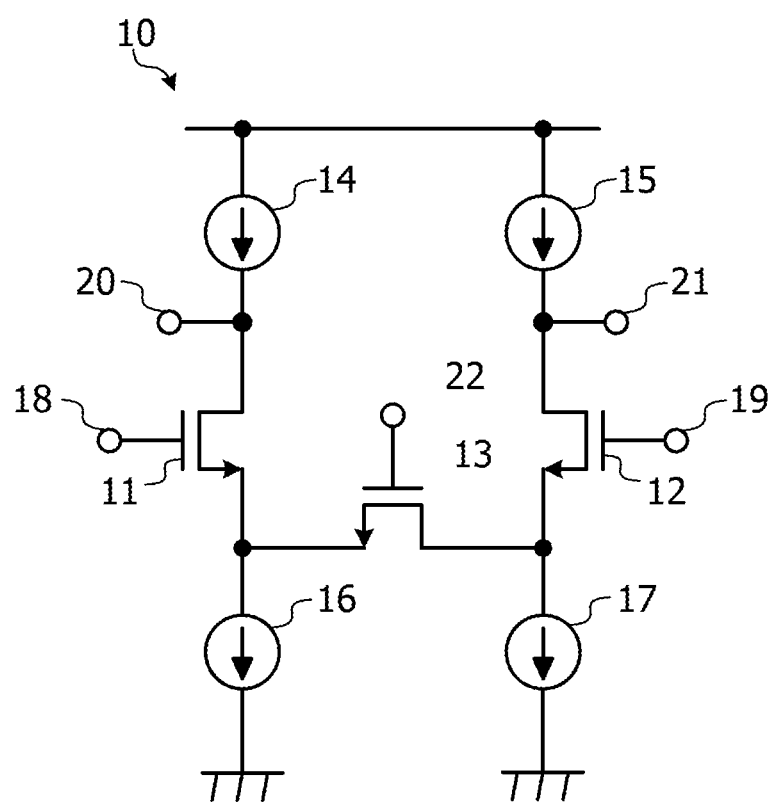
FIG. 1 is a diagram illustrating an example of the configuration of a related-art OTA circuit.
Figure 2:
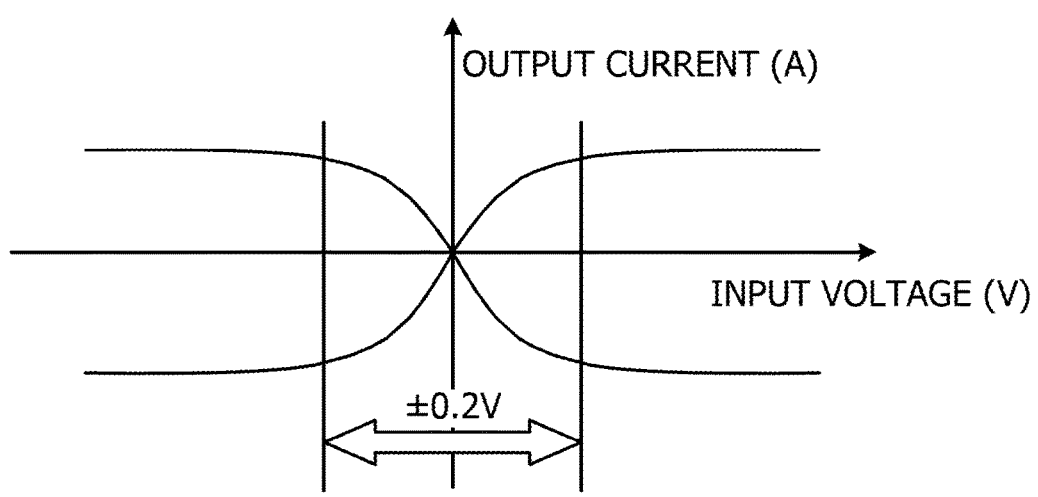
FIG. 2 is a diagram illustrating an example of the input-output characteristic of the related-art OTA circuit.
Figure 3:
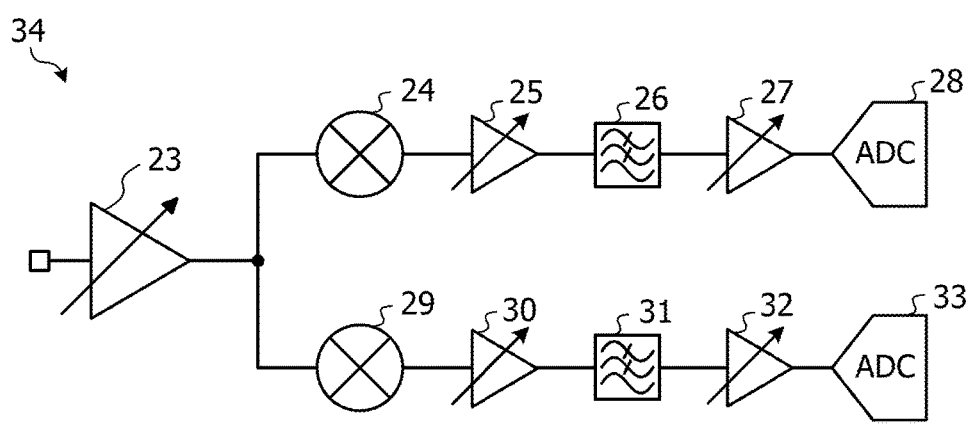
FIG. 3 is a diagram illustrating an example of the configuration of a reception device including a filter according to the present embodiment.

FIG. 3 is a diagram illustrating an example of the configuration of a reception device including a filter according to the present embodiment. The reception device 34 receives high-speed data wirelessly or wiredly. The reception device 34 is used, for example, in a system that transmits and receives radio waves in the millimeter wave band. The reception device 34 includes a low-noise amplifier 23, mixers 24 and 29, variable gain amplifiers 25, 30, 27, and 32, filters 26 and 31, and analog-to-digital converters (ADCs) 28 and 33.

The mixer 24 mixes a reception signal amplified by the low-noise amplifier 23 with an I-phase local signal so as to perform detection. The mixer 29 performs detection by mixing the reception signal amplified by the low-noise amplifier 23 with a Q-phase local signal having a phase shifted by π/2 with respect to the I-phase local signal. Thereby, an intermediate frequency (IF) signal or a baseband (BB) signal is obtained.

An I signal, which is one of the IF signal or the BB signal output from the mixer 24, is amplified by the variable gain amplifier 25 and is subjected to filter processing by the filter 26. An analog I signal having been subjected to the filter processing by the filter 26 is amplified by the variable gain amplifier 27 and is converted into digital data by the ADC 28. In the same manner, a Q signal, which is one of the IF signal or the BB signal output from the mixer 29, is amplified by the variable gain amplifier 30 and is subjected to filter processing by the filter 31. An analog Q signal having been subjected to the filter processing by the filter 31 is amplified by the variable gain amplifier 32 and is converted into digital data by the ADC 33.

It is possible to apply a filter according to the present embodiment to each of the filters 26 and 31. It is possible to apply an OTA circuit according to the present embodiment to an OTA circuit used in each of the filters 26 and 31. In this regard, it is possible to apply a filter and an OTA circuit according to the present embodiment to a filter and an OTA circuit used in a transmission device.

Also, a filter and an OTA circuit according to the present embodiment is not limited for use in a communication device that transmits and receives a signal in the millimeter wave band. For example, a filter and an OTA circuit according to the present embodiment is applicable to a device that transmits and receives a signal in the other frequency bands, such as an ultra high frequency (UHF) band, or the like.

The filters 26 and 31 are analog baseband filters. In a communication system in which a high data rate is requested, a relatively wide baseband bandwidth is used, and thus the cut-off frequencies requested by the filters 26 and 31 become high. For example, in the case of transmitting and receiving a signal in the millimeter wave band, the requested cut-off frequency is expanded to about hundreds of MHz.

A GmC filter is known as a filter capable of widening the cut-off frequency to about hundreds of MHz. A GmC filter is a filter circuit including a transconductor that converts a voltage signal into a current signal by a predetermined transconductance (Gm), and a capacitor (C) that integrates the current signal. However, in the related-art GmC filter, distortion produced by a transconductor tends to become large, and the amplitude of a differential input voltage permitted to be handled becomes small (for example, about 0.4 V). With an OTA circuit used for a filter according to the present embodiment, it is possible to expand a voltage range where a differential input voltage is inputtable.

Next, a detailed description will be given of the configuration of a filter and an OTA circuit according to the embodiment.

Figure 4:
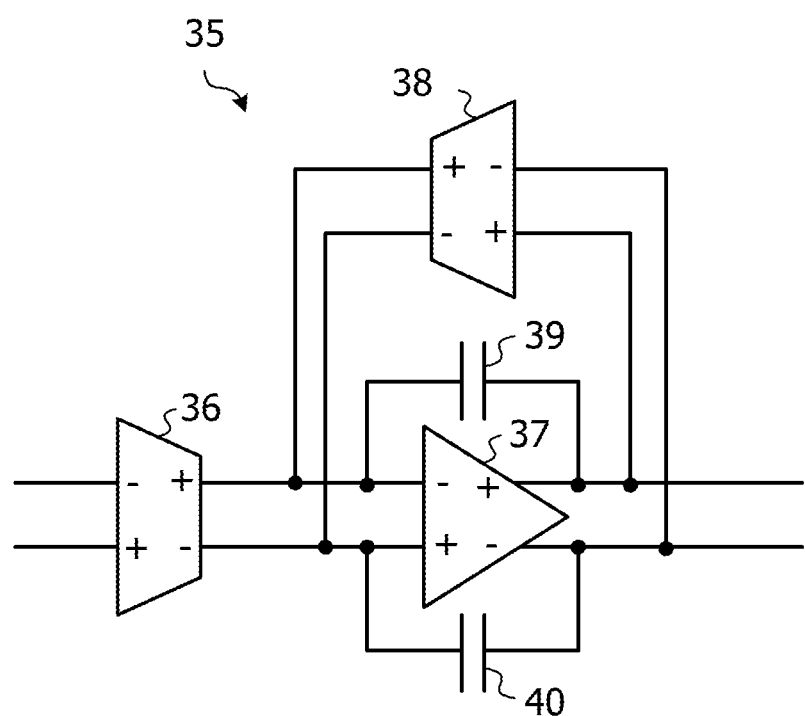
FIG. 4 is a diagram illustrating an example of a first configuration of a filter according to the present embodiment.

FIG. 4 is a diagram illustrating an example of a first configuration of a filter according to the present embodiment. A filter 35 is an example of a primary GmC filter. The filter 35 is a low pass filter including a first OTA circuit 36, a second OTA circuit 38, an operational amplifier 37, and a pair of capacitors 39 and 40.

The OTA circuit 36 is a transconductor that converts a differential input voltage into differential output currents. The OTA circuit 36 includes a differential input stage that receives input of a differential input voltage and a differential output stage that outputs differential output currents.

The operational amplifier 37 is a circuit that performs differential amplification on a differential input voltage and outputs a differential output voltage. The operational amplifier 37 includes a differential input unit connected to the differential output stage of the OTA circuit 36, and the differential output stage of the OTA circuit 38, and a differential output unit that outputs a differential output voltage produced by performing differential amplification on the differential input voltage input to the differential input unit.

The non-inverted output nodes of the differential output stages of the OTA circuits 36 and 38 are connected to the inverted input node of the differential input unit of the operational amplifier 37, and the inverted output nodes of the differential output stage of the OTA circuits 36 and 38 are connected to the non-inverted input node of the differential input unit of the operational amplifier 37. The non-inverted input node of the differential input stage of the OTA circuit 38 is connected to the non-inverted output node of the differential output unit of the operational amplifier 37, and the inverted input node of the differential input stage of the OTA circuit 38 is connected to the inverted output node of the differential output unit of the operational amplifier 37.

The OTA circuit 38 is a transconductor that converts the differential output voltage output from the differential output unit of the operational amplifier 37 to differential output currents. The differential input stage of the OTA circuit 38 is connected to the differential output unit of the operational amplifier 37, and the differential output stage of the OTA circuit 38 is connected to the differential input unit of the operational amplifier 37. That is to say, the OTA circuit 38 feeds back the differential output voltage of the operational amplifier 37 to the differential input unit of the operational amplifier 37.

A pair of capacitors 39 and 40 is an integration capacitor which is supplied with the differential output currents output from the differential output stage of the OTA circuit 36 and the differential output stage of the OTA circuit 38 respectively, and is connected between the differential input unit of the operational amplifier 37 and the differential output unit of the operational amplifier 37. One end of the capacitor 39 is connected to the inverted input node of the differential input unit of the operational amplifier 37, and the other end of the capacitor 39 is connected to the non-inverted output node of the differential output unit of the operational amplifier 37. One end of the capacitor 40 is connected to the non-inverted input node of the differential input unit of the operational amplifier 37, and the other end of the capacitor 40 is connected to the inverted output node of the differential output unit of the operational amplifier 37.

Figure 5:
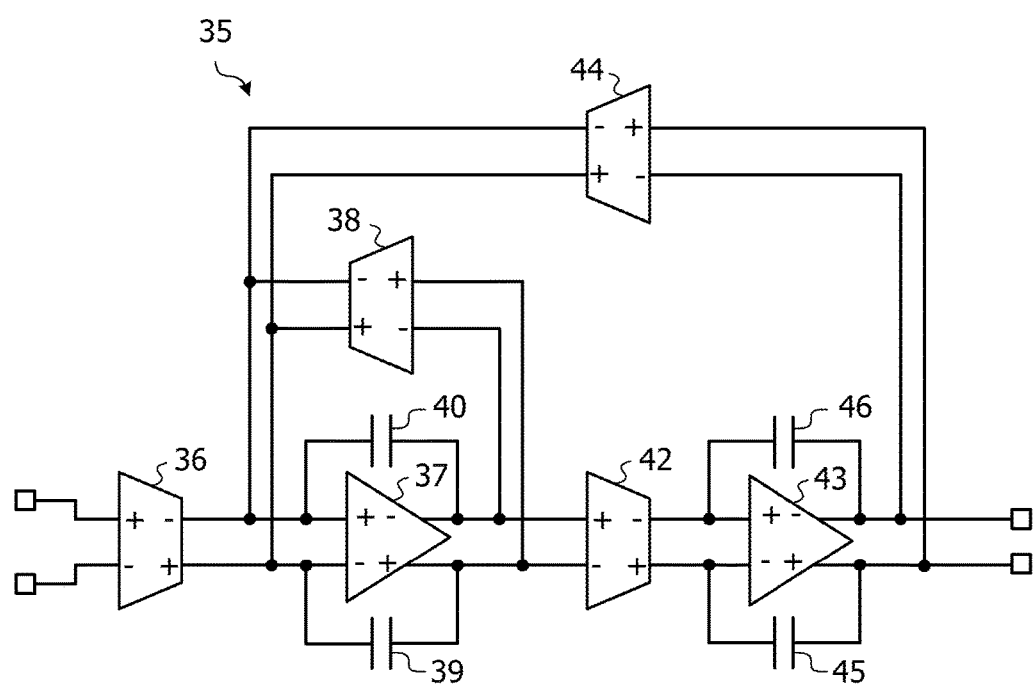
FIG. 5 is a diagram illustrating an example of a second configuration of a filter according to the present embodiment.

FIG. 5 is a diagram illustrating an example of a second configuration of a filter according to the present embodiment. A filter 41 is an example of a secondary GmC filter. The filter 41 a low pass filter including a first OTA circuit 36, a second OTA circuit 38, a third OTA circuit 42, a fourth OTA circuit 44, a first operational amplifier 37, a second operational amplifier 43, a pair of capacitors 39 and 40, and a pair of capacitors 45 and 46. In the filter 41, OTA circuits 42 and 44, an operational amplifier 43 and a pair of capacitors 45 and 46 are added to the filter 35 in FIG. 4.

The OTA circuit 42 is a transconductor that converts the differential output voltages output from the differential output unit of the operational amplifier 37 into differential output currents. The OTA circuit 42 includes a differential input stage that receives the differential output voltage of the operational amplifier 37 as differential input voltage and a differential output stage that outputs differential output currents. The OTA circuit 44 is a transconductor that converts the differential output voltage output from the differential output unit of the operational amplifier 43 into differential output currents. The differential input stage of the OTA circuit 44 is connected to the differential output unit of the operational amplifier 43, and the differential output stage of the OTA circuit 44 is connected to the differential input unit of the operational amplifier 37. That is to say, the OTA circuit 44 feeds back the differential output voltage of the operational amplifier 43 to the differential input unit of the operational amplifier 37. The other connection forms are the same as those in FIG. 4.

Figure 6:
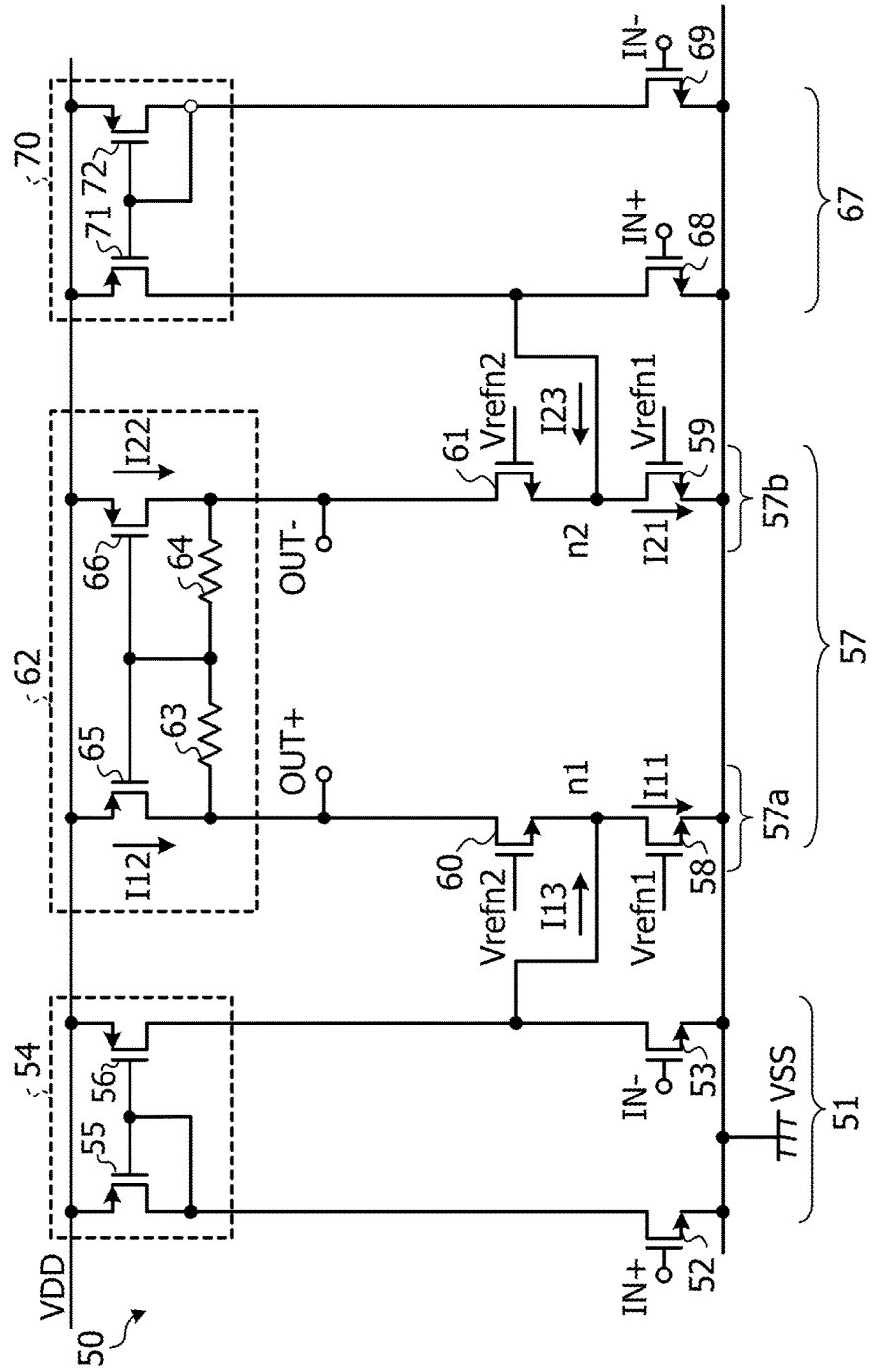
FIG. 6 is a diagram illustrating an example of a first configuration of an OTA circuit according to the present embodiment.

FIG. 6 is a diagram illustrating an example of a first configuration of an OTA circuit according to the present embodiment. It is possible to use an OTA circuit 50 illustrated in FIG. 6 as the OTA circuit illustrated in FIGS. 4 and 5.

The OTA circuit 50 includes a first input stage 51, which is a source-grounded differential input stage, a second input stage 67, which is a source-grounded differential input stage, and an output stage 57, which is a differential output stage.

The input stage 51 includes a first pair of transistors 52 and 53 having sources connected to a reference potential VSS and converts a differential input voltage IN+ and IN− input to the gates of the first pair of transistors 52 and 53 respectively into a first control current I13. The transistors 52 and 53 are NMOSs. The reference potential VSS is, for example, a ground potential.

The first pair of transistors 52 and 53 is a pair of the transistor 52 having a gate that receives one input voltage IN+ out of the differential input voltage IN+ and IN− and the transistor 53 having a gate that receives the other input voltage IN− out of the differential input voltage IN+ and IN−. The input stage 51 subtracts the drain current of the transistor 53 from the drain current of the transistor 52 to generate the first control current I13. The first control current I13 is a first difference current obtained by subtracting the drain current of the transistor 53 from the drain current of the transistor 52.

The input stage 51 includes, for example, a first current mirror 54 connected between the drains of the first pair of transistors 52 and 53 and a power source potential VDD. The power source potential VDD is a potential higher than that of the reference potential VSS. The current mirror 54 outputs an output current that is the identical or proportional to the drain current of the transistor 52. The current mirror 54 has a configuration in which an input-side transistor 55 and an output-side transistor 56 have a current mirror connection. The transistors 55 and 56 are PMOSs. The source of the transistor 55 is connected to the power source potential VDD, and the gate and the drain of the transistor 55 connected with each other are connected to the drain of the transistor 52 and the gate of the transistor 56. The source of the transistor 56 is connected to the power source potential VDD, and the drain of the transistor 56 is connected to the drain of the transistor 53.

The input stage 67 includes a second pair of transistors 68 and 69 having sources connected to the reference potential VSS and converts the differential input voltage IN+ and IN− input to the gates of the second pair of transistors 68 and 69 respectively into a second control current I23. The transistors 68 and 69 are NMOSs.

The second pair of transistors 68 and 69 is a pair of the transistor 68 having a gate that receives one input voltage IN+ out of the differential input voltage IN+ and IN− and the transistor 69 having a gate that receives the other input voltage IN− out of the differential input voltage IN+ and IN−. The input stage 67 subtracts the drain current of the transistor 68 from the drain current of the transistor 69 to generate the second control current I23. The second control current I23 is a second difference current obtained by subtracting the drain current of the transistor 68 from the drain current of the transistor 69.

The input stage 67 includes, for example, a second current mirror 70 connected between the drains of the second pair of transistors 68 and 69 and the power source potential VDD. The current mirror 70 has a configuration in which an input-side transistor 72 and an output-side transistor 71 have a current mirror connection. The transistors 72 and 71 are PMOSs. The source of the transistor 72 is connected to the power source potential VDD, and the gate and the drain of the transistor 72 connected with each other are connected to the drain of the transistor 69 and the gate of the transistor 71. The source of the transistor 71 is connected to the power source potential VDD, and the drain of the transistor 71 is connected to the drain of the transistor 68.

The output stage 57 outputs a differential output current OUT+ and OUT− in accordance with the first control current I13 and the second control current I23. The output stage 57 includes a first cascode circuit 57a and a second cascode circuit 57b. The first cascode circuit 57a is an example of the first output circuit. The second cascode circuit 57b is an example of the second output circuit.

The cascode circuit 57a generates one output current OUT+ out of the differential output currents OUT+ and OUT− in accordance with the first control current I13. The cascode circuit 57a has a cascode configuration, for example, in which a transistor 58, a transistor 60, and a transistor 65 are connected in a vertically concatenated manner. The transistors 58 and 60 are NMOSs. The transistor 65 is a PMOS. The cascode circuit 57a outputs the output current OUT+ from the drain of the transistor 60.

The transistor 58 has a drain connected to a first node n1 supplied with the first control current I13, a source connected to the reference potential VSS, and a gate that receives input of an input voltage Vrefn1. The transistor 58 is an example of the first current source, and a drain current I11 flows therethough.

The transistor 60 has a source connected to the first node n1, a drain connected to the drain of the transistor 65, and a gate that receives input of a control voltage Vrefn2. The transistor 60 forms an NMOS cascode configuration with the transistor 58.

The transistor 65 has a drain connected to the drain of the transistor 60, a source connected to the power source potential VDD, and a gate connected to the drain of the transistor 65 via a resistor 63 and connected to the gate of the transistor 66. The transistor 65 is an example of the second current source, and a bias current I12 flows therethrough. The output stage 57 includes an output stage load unit 62, and the transistor 65 is a load transistor in the output stage load unit 62.

The cascode circuit 57b generates the other output current OUT− out of the differential output currents OUT+ and OUT− in accordance with the second control current I23. The cascode circuit 57b has a cascode configuration, for example, in which a transistor 59, a transistor 61, and a transistor 66 are connected in a vertically concatenated manner. The transistors 59 and 61 are NMOSs. The transistor 66 is a PMOS. The cascode circuit 57b outputs the output current OUT− from the drain of the transistor 61.

The transistor 59 has a drain connected to a second node n2 supplied with the second control current I23, a source connected to the reference potential VSS, and a gate that receives input of the input voltage Vrefn1. The transistor 59 is an example of the third current source, and a drain current I21 flows therethrough.

The transistor 61 has a source connected to the second node n2, a drain connected to the drain of the transistor 66, and a gate that receives input of a control voltage Vrefn2. The transistor 66 forms an NMOS cascode configuration with the transistor 59.

The transistor 66 has a drain connected to the drain of the transistor 61, a source connected to the power source potential VDD, and a gate connected to the drain of the transistor 66 via a resistor 64 and the gate of the transistor 65. The transistor 65 is an example of the fourth current source, and a bias current I22 flows therethrough. The transistor 66 is a load transistor included in an output stage load unit 62 held by the output stage 57. The output stage 57 includes the output stage load unit 62, and the transistor 66 is a load transistor in the output stage load unit 62.

Next, a description will be given of the circuit operation of the OTA circuit 50.

The drain current I11 is the sum of the first control current I13 and the bias current I12, and the drain current I21 is the sum of the second control current I23 and the bias current I22. Accordingly, if the input voltage IN+ becomes higher than the input voltage IN−, the first control current I13 increases in the direction illustrated by an arrow in FIG. 6, and the second control current I23 increases in the direction opposite to the direction illustrated by the arrow in FIG. 6. Accordingly, the drain current of the transistor 60 decreases, and [the source current from OUT+ terminal increases]. The drain current of the transistor 61 increases, and [the sink current to OUT− terminal increases]. On the contrary, if the input voltage IN− becomes higher than the input voltage IN+, the first control current I13 increases in the direction opposite to the direction illustrated by the arrow in FIG. 6, and the second control current I23 increases in the direction illustrated by the arrow in FIG. 6. Accordingly, the output current OUT+ increases at the suction side, and the discharged output current OUT− increases.

That is to say, the OTA circuit 50 functions as a transconductor that generates differential output currents OUT+ and OUT− in accordance with the magnitude of differential input voltage IN+ and N−. Also, in the OTA circuit 50, the input stages 51 and 67 convert a voltage into a current using the source-grounded transistors 52, 53, 68, and 69, and thus it is possible to ensure a relatively wide dynamic range at the drain side of the transistors 52, 53, 68, and 69. As a result, it is possible to expand the voltage range in which the differential input voltage IN+ and IN− is allowed to be input to the gates of the input stages 51 and 67. Also, the differential output currents OUT+ and OUT− are output via the cascode circuits 57a and 57b, and thus it is possible to increase the output impedance of the output stage 57 from which the differential output currents OUT+ and OUT− are output. An increase in the output impedance of the output stage 57 of the OTA circuit 50 results in an increase in the stability of the frequency characteristic of the filter (for example, the filter 35 in FIG. 4 and the filter 41 in FIG. 5) using the operational amplifier having an input unit connected to the output stage 57 of the OTA circuit 50.

Figure 7:
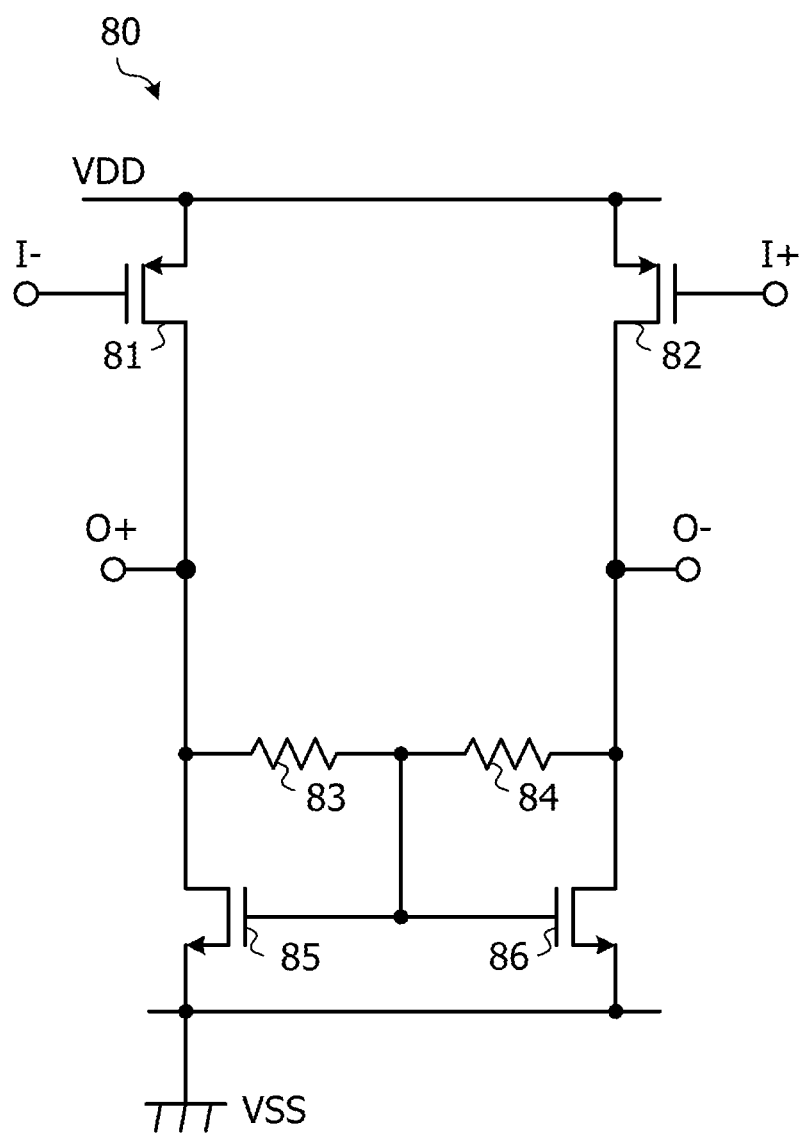
FIG. 7 is a diagram illustrating an example of the configuration of an operational amplifier included in a filter according to the present embodiment.

FIG. 7 is a diagram illustrating an example of the configuration of an operational amplifier included in a filter according to the present embodiment. It is possible to use an operational amplifier 80 illustrated in FIG. 7 as an operational amplifier illustrated in FIGS. 4 and 5.

The operational amplifier 80 includes a third transistor pair 81 and 82, which is an input unit, and a fourth transistor pair 85 and 86 having respective sources connected to the reference potential VSS. The operational amplifier 80 outputs differential voltage O+ and O− between the drains of the third transistor pair 81 and 82 and the drains of the fourth transistor pair 85 and 86.

Differential output nodes from which the differential output currents OUT+ and OUT− of the OTA circuit 50 described above are output are connected to the respective gates of the third transistor pair 81 and 82. The transistors 81 and 82 are PMOSs. The source of the transistor 81 is connected to the power source potential VDD, the gate thereof is connected to a non-inverted input node (a node from which the output current OUT+ is output) out of the differential output nodes of the OTA circuit 50, and the drain thereof is connected to the drain of the transistor 85. The source of the transistor 82 is connected to the power source potential VDD, the gate thereof is connected to an inverted input node (a node from which the output current OUT− is output) out of the differential output nodes of the OTA circuit 50, and the drain thereof is connected to the drain of the transistor 86.

The transistors 85 and 86 are NMOSs. The transistor 85 has a drain connected to the drain of the transistor 81, a source connected to the reference potential VSS, and a gate connected to the drain of the transistor 85 via a resistor 83 and connected to the gate of the transistor 86. The transistor 86 has a drain connected to the drain of the transistor 82, a source connected to the reference potential VSS, and a gate connected to the drain of the transistor 86 via a resistor 84 and connected to the gate of the transistor 85.

Figure 8:
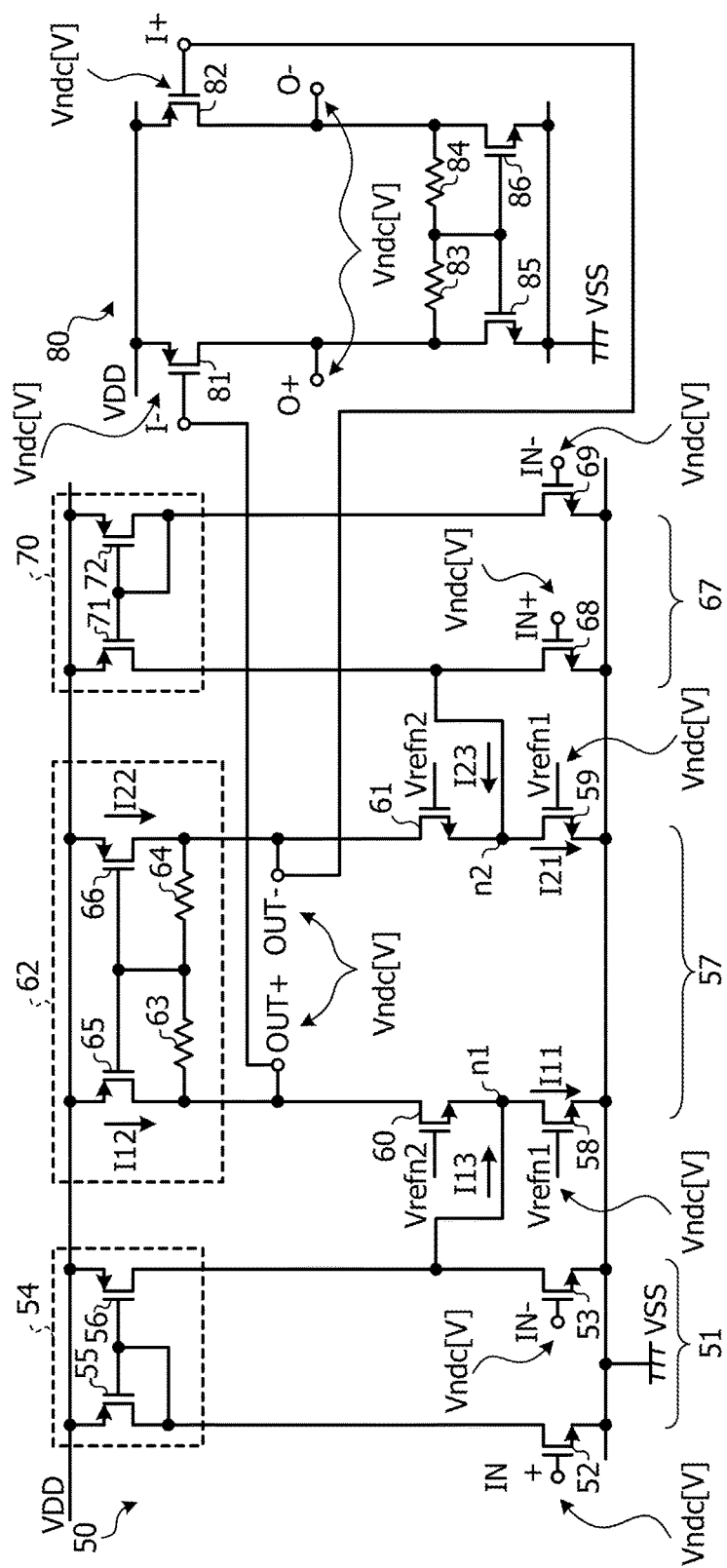
FIG. 8 is a diagram illustrating an example of the configuration of a circuit in which an OTA circuit and an operational amplifier are connected.

FIG. 8 is a diagram illustrating an example of the configuration of a circuit in which the OTA circuit 50 and the operational amplifier 80 are connected. Each of the NMOSs (transistors 52, 53, 68, and 69) in the input stages 51 and 67 has the same size ratio between gate length and gate width with each other. Each of the NMOSs (transistors 58 and 59) in the output stage 57 has the same size ratio between gate length and gate width with each other. Each of the NMOSs (transistors 60 and 61) in the output stage 57 has the same size ratio between gate length and gate width with each other. Each of the PMOSs (transistors 65 and 66) in the output stage 57 has the same size ratio between gate length and gate width with each other. Each of the NMOSs (transistors 85 and 86) of the load unit in the operational amplifier 80 has the same size ratio between gate length and gate width with each other. Each of the PMOSs (transistors 81 and 82) of the input unit in the operational amplifier 80 has the same size ratio between gate length and gate width with each other.

Also, the gate length and the gate width are formed such that the size ratio between gate length and gate width of the NMOS transistors 58 and 59 to the PMOS transistors 65 and 66 is equal to the size ratio of the NMOS transistors 85 and 86 to the PMOS transistors 81 and 82. The same direct current voltage Vndc as the direct current voltage component Vndc, which is a center voltage of the differential input voltage IN+ and IN− of an alternating current wave, is input to the gates of the transistors 58 and 59 as an input voltage refn1. By satisfying these two conditions, the direct current voltage component Vndc of the differential input voltage IN+ and IN− becomes substantially equal to the direct current voltage component of the differential output voltage output from the differential output nodes of the output stage 57. Thereby, a common mode feedback (CMFB) circuit does not have to be provided that adjusts the differential output currents OUT+ and OUT− so as to stabilize the differential output voltage output from the differential output nodes of the output stage 57. That is to say, it is possible to connect the OTA circuit 50 and the operational amplifier 80 without stabilizing the direct current voltage using the CMFB circuit.

Figure 9:
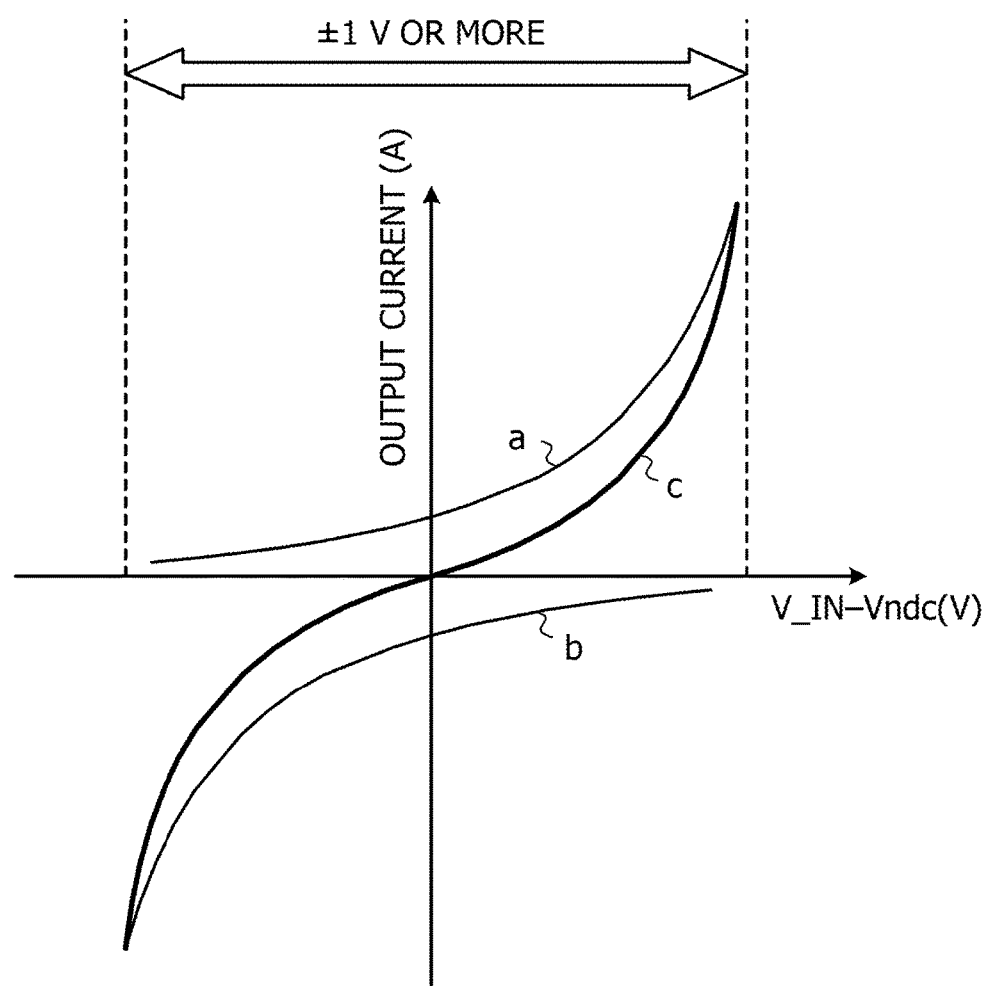
FIG. 9 is a diagram illustrating an example of the input-output characteristic of an OTA circuit according to the present embodiment.

FIG. 9 is a diagram illustrating an example of the input-output characteristic of an OTA circuit according to the present embodiment. Reference sign a denotes the input-output characteristic when a current is discharged from the source-grounded transistor 52 that receives input of the input voltage IN+ to the first node n1. Reference sign b denotes the input-output characteristic when a current is discharged from the source-grounded transistor 53 that receives input of the input voltage IN− to the first node n1. By using a source-grounded transistor in the input stage of the OTA circuit, it is possible to expand the voltage range where the differential input voltage IN+ and IN− is inputtable to the input stages 51 and 67 to, for example, ±1 V or more (refer to the input-output characteristic c). V_IN denotes input voltage IN+ or input voltage IN−.

The drain current of a MOS transistor has a characteristic proportional to the square of the difference between the gate voltage and the threshold voltage. Thus the drain current has the input-output characteristic c of an expanded inputtable voltage range, but the higher the input voltage, the larger distortion. However, as illustrated in FIGS. 4 and 5, the output stage of one of the OTA circuits is connected to the output stage of the other of the OTA circuits that feeds back the output of the operational amplifier so that the nonlinearities of the two OTA circuits are canceled. Accordingly, it is possible to bring the input-output characteristic of a GmC filter closer to linear.

Figure 10:
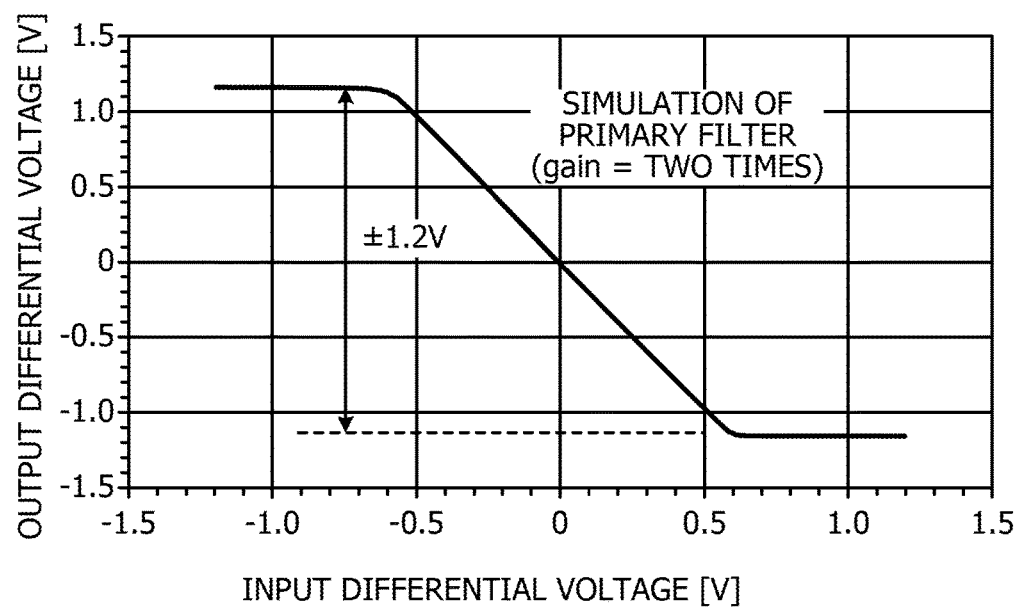
FIG. 10 is a diagram illustrating an example of a simulation result of a primary filter.

FIG. 10 is a diagram illustrating an example of a simulation result of the input-output characteristic of a primary filter (specifically, the filter 35 in FIG. 4). As illustrated in FIG. 10, even if the absolute value of the input differential voltage becomes large, it becomes unlikely for the output differential voltage to be distorted, and thus it is possible to bring the input-output characteristic of the filter closer to linear. Also, it is possible to expand the amplitudes of the output differential voltage to ±1.2 V.

Figure 11:
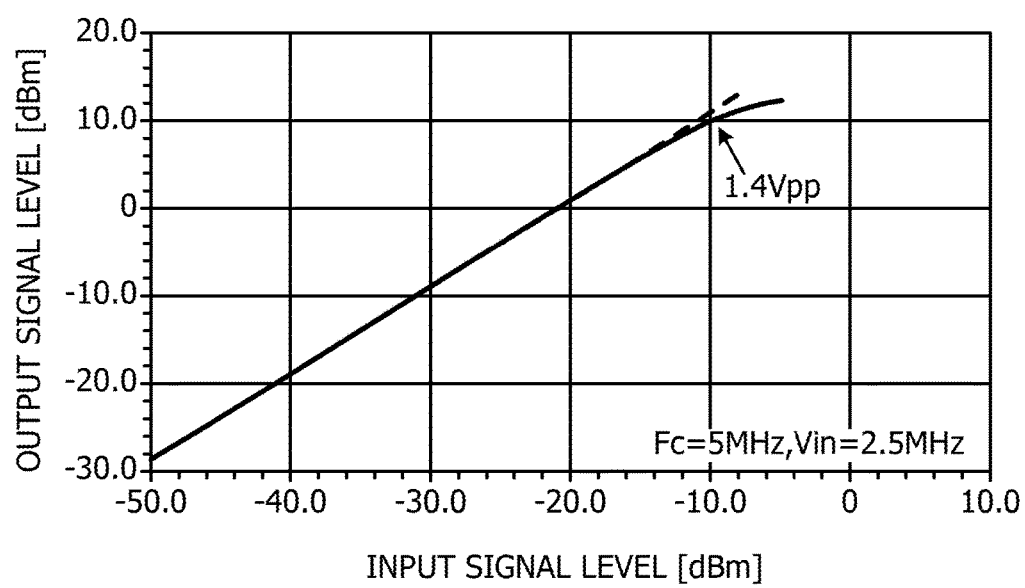
FIG. 11 is a diagram illustrating an example of a simulation result of a fifth order Butterworth filter.

FIG. 11 is a diagram illustrating an example of a simulation result of a fifth order Butterworth filter. The fifth order Butterworth filter has a configuration in which one primary filter 35 (refer to FIG. 4) and two secondary filters 41 (refer to FIG. 5) are connected in combination. In the same manner as in FIG. 10, even if the absolute value of the input differential voltage becomes large, it becomes unlikely for the output differential voltage to be distorted, and thus it is possible to bring the input-output characteristic of the filter closer to linear. Also, it is possible to expand the amplitude of the output differential voltage to 1.4 Vpp (that is to say, ±1.4 V). In this regard, in FIG. 11, the cut-off frequency Fc is 5 MHz, the frequency of the input differential voltage Vin is 2.5 MHz, and the power source voltage between the power source potential VDD and the reference potential VSS is 1.2 V.

Figure 12:
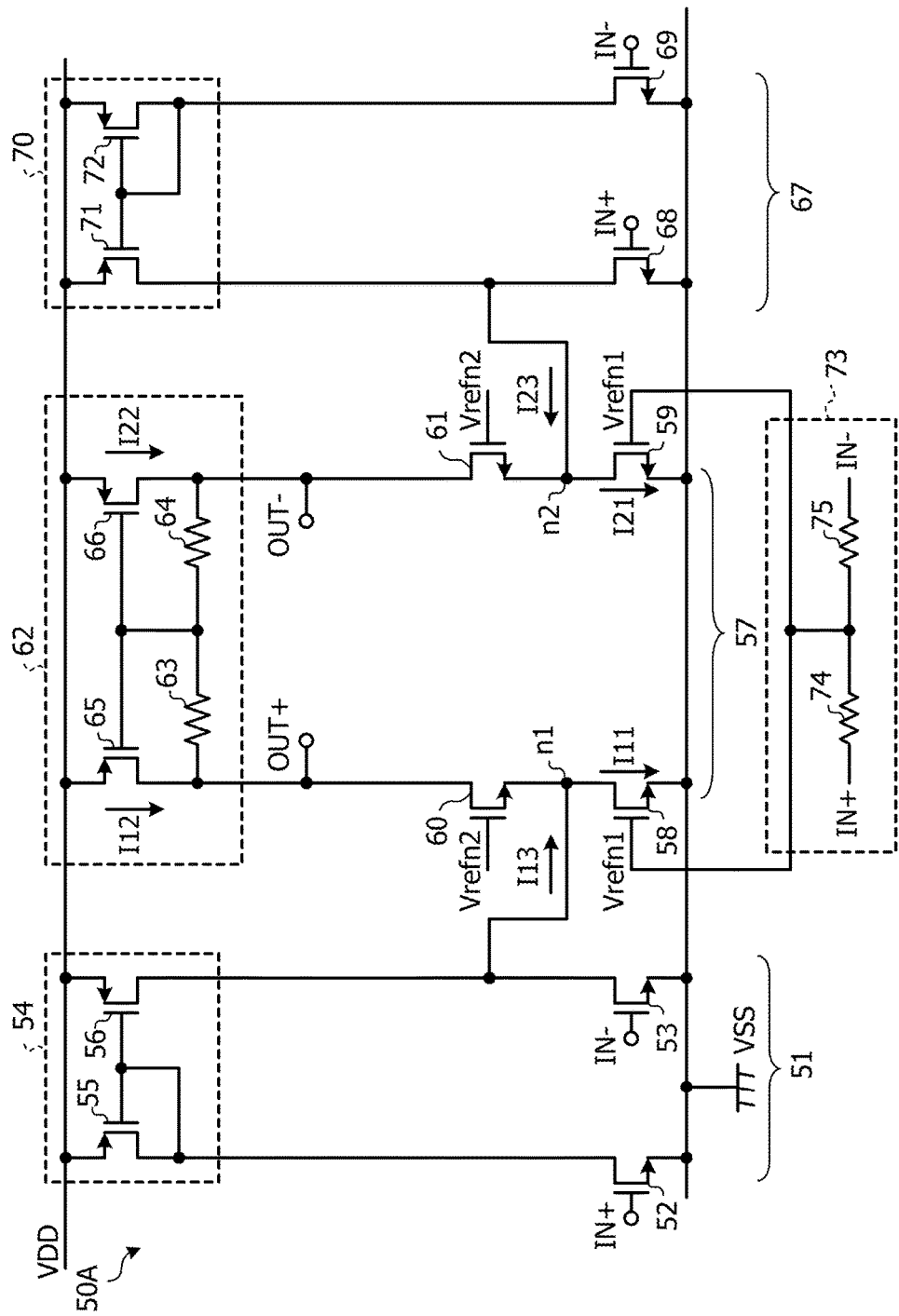
FIG. 12 is a diagram illustrating an example of the configuration of an OTA circuit including a generation circuit of Vrefn1.

FIG. 12 is a diagram illustrating an example of the configuration of an OTA circuit including a generation circuit of Vrefn1. An OTA circuit 50A includes a voltage divider circuit 73 as an example of a generation circuit of the input voltage Vrefn1 input to the gates of the transistors 58 and 59. The voltage divider circuit 73 divides the differential input voltage IN+ and IN− by resistors 74 and 75, and supplies the divided voltages to the gate of the transistor 58 and the gate of the transistor 59 as the input voltage Vrefn1.

Figure 13:
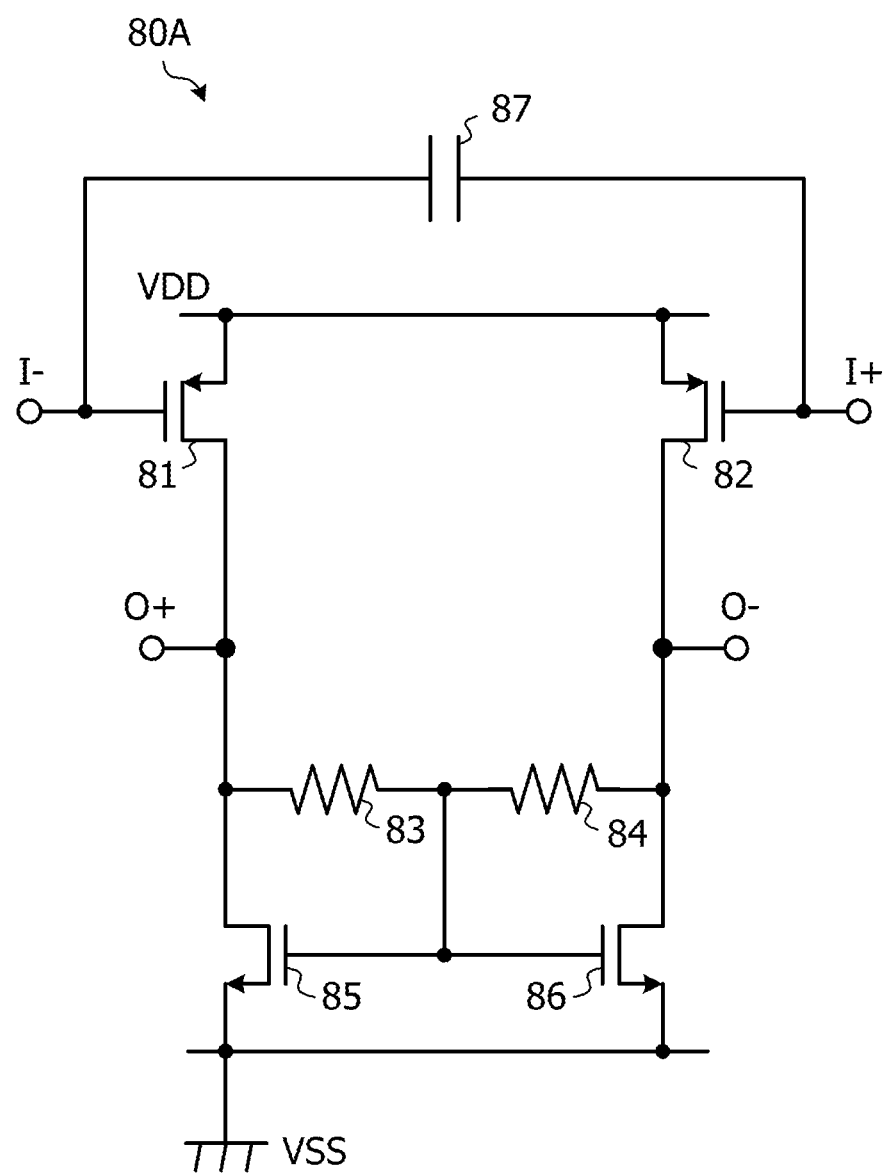
FIG. 13 is a diagram illustrating an example of the configuration of an operational amplifier including a phase compensation capacitor.

FIG. 13 is a diagram illustrating an example of the configuration of an operational amplifier having a phase compensation capacitor. An operational amplifier 80A includes a gate capacitance 87 connected between the gates of the third transistor pair 81 and 82. With the gate capacitance 87, phase compensation is performed between a differential voltage I− input to the gate of the transistor 81 and a differential voltage I+ input to the gate of the transistor 82, and thus differential voltage O+ and O− output from the operational amplifier 80A is stabilized.

Also, the gate capacitance 87 may be a variable capacitor array having a capacitance value that changes depending on a control signal Vx. Thereby, it is possible to change the cut-off frequency of the filter.

Figure 14:
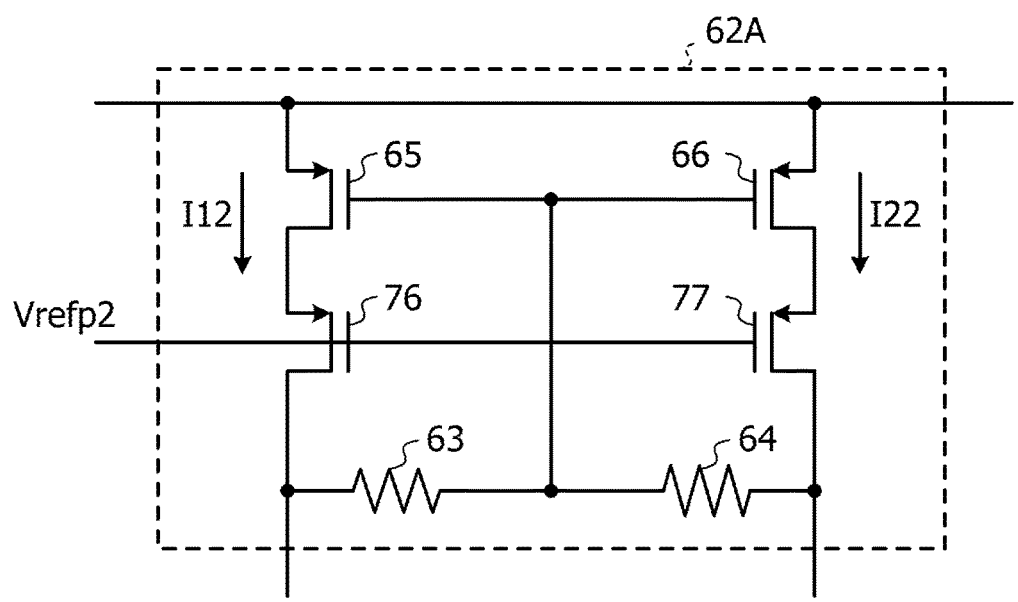
FIG. 14 is a diagram illustrating an example of the configuration of an output stage load unit having a cascode configuration.

FIG. 14 is a diagram illustrating an example of the configuration of an output stage load unit having a cascode configuration. The output stage load unit 62A has a cascode configuration in which at least one transistor 76 is connected to a transistor 65 in a vertically concatenated manner and a cascode configuration in which at least one transistor 77 is connected to a transistor 66 in a vertically concatenated manner. The transistors 76 and 77 are PMOSs. A voltage Vrefp2 is input to the gates of the transistors 76 and 77. The output stage load unit 62A has a pair of cascode configurations, and thus the output impedance of the OTA circuit increases.

Figure 15:
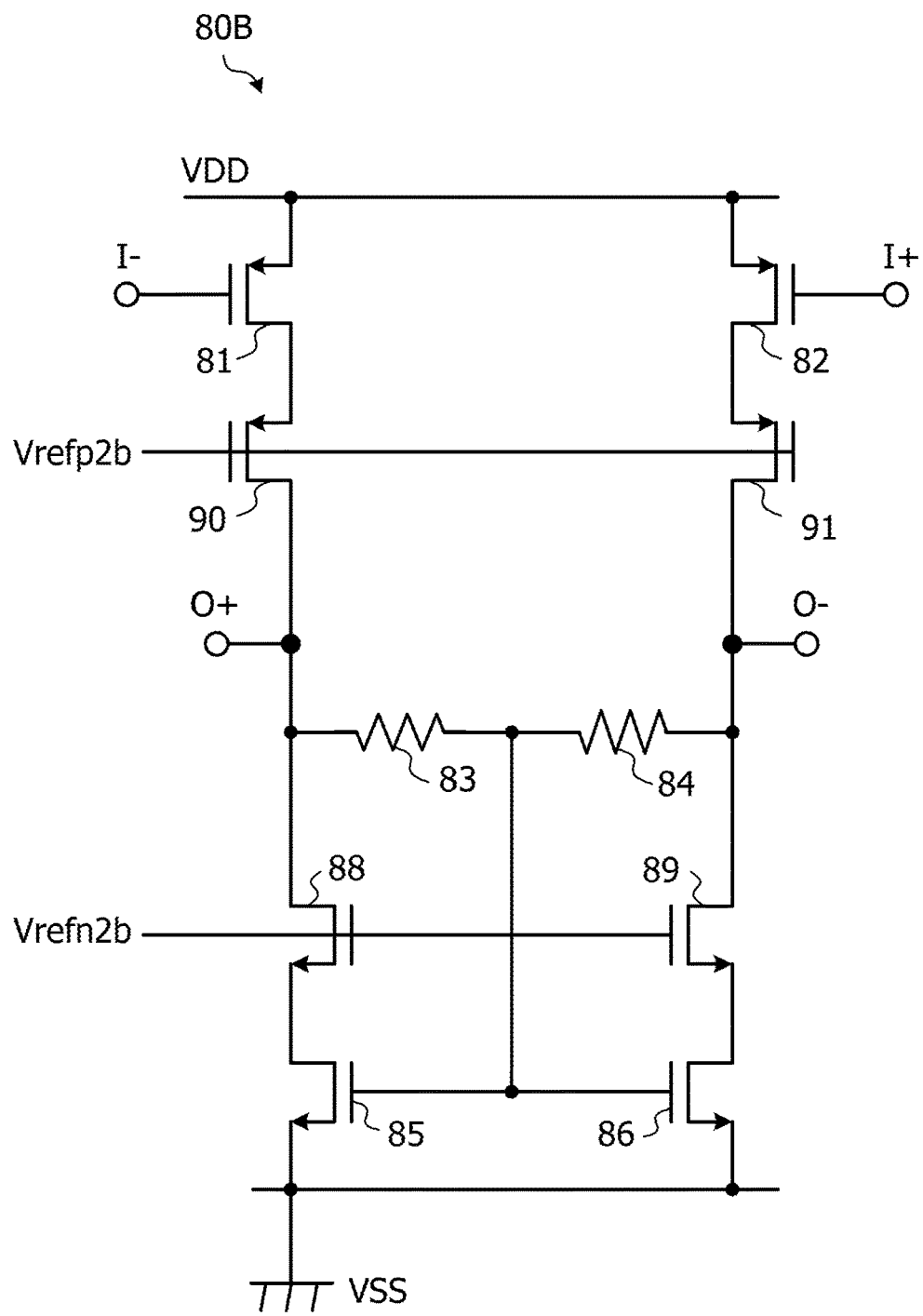
FIG. 15 is a diagram illustrating an example of the configuration of an operational amplifier having a cascode configuration.

FIG. 15 is a diagram illustrating an example of the configuration of an operational amplifier having a cascode configuration. An operational amplifier 80B may have a pair of cascode configurations in an input unit that receives input of differential voltage I+ and I−. The input unit of the operational amplifier 80B has a cascode configuration in which at least one transistor 90 is connected to a transistor 81 in a vertically concatenated manner and a cascode configuration in which at least one transistor 91 is connected to a transistor 82 in a vertically concatenated manner. A voltage Vrefp2$b$ is input to the gates of the transistors 90 and 91. The transistors 90 and 91 are PMOSs.

Also, the load unit of the operational amplifier 80B has a cascode configuration in which at least one transistor 88 is connected to a transistor 85 in a vertically concatenated manner and a cascode configuration in which at least one transistor 89 is connected to a transistor 86 in a vertically concatenated manner. A voltage Vrefbn2$b$ is input to the gates of the transistors 88 and 89. The transistors 88 and 89 are NMOSs.

In this manner, by providing the operational amplifier with a cascode configuration, it is possible to increase the output impedance of the operational amplifier.

Figure 16:
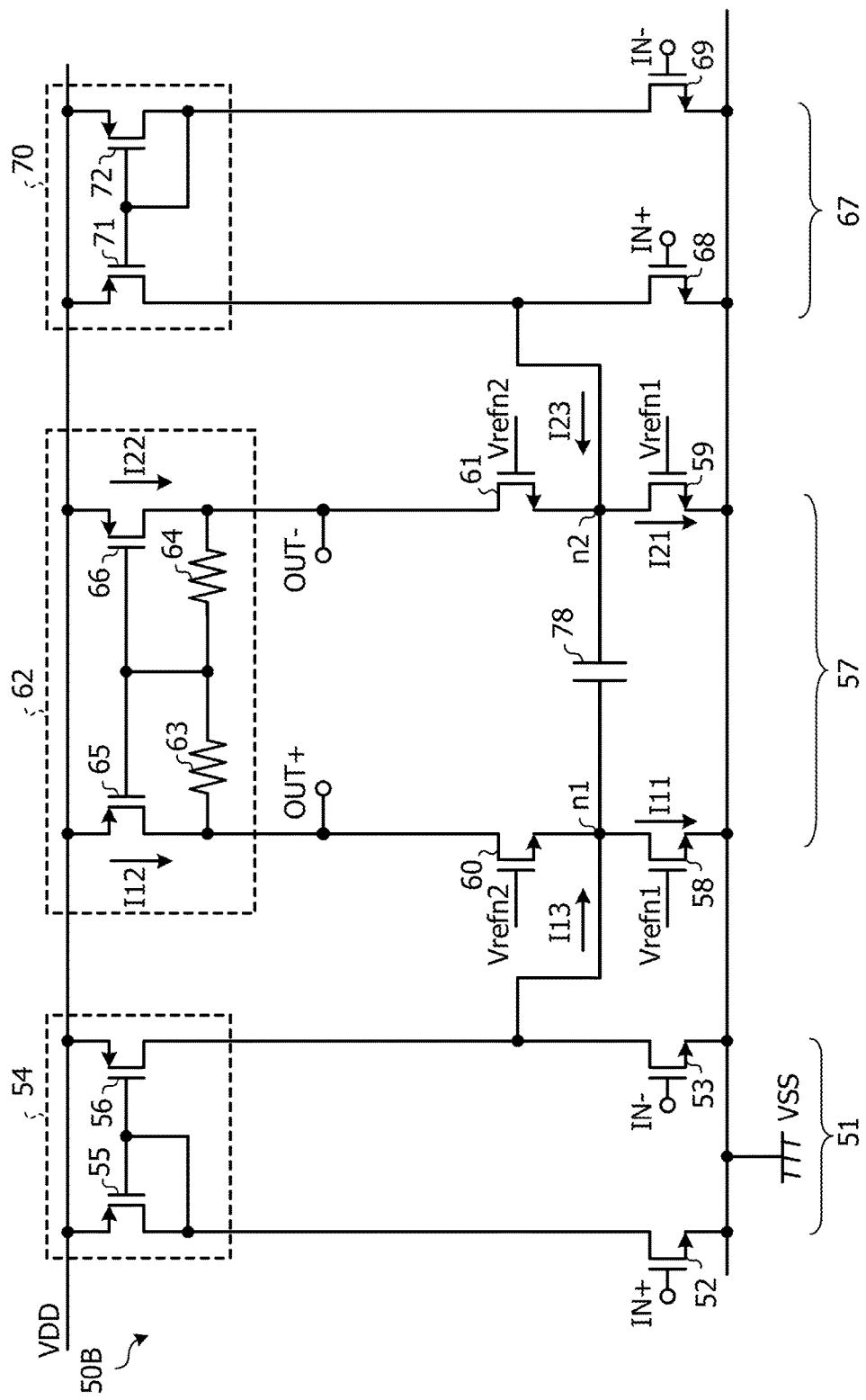
FIG. 16 is a diagram illustrating an example of the configuration of an OTA circuit including a phase compensation capacitor.

FIG. 16 is a diagram illustrating an example of the configuration of an OTA circuit including a phase compensation capacitor. An OTA circuit 50B includes a capacitor 78 connected between the first node n1 and the second node n2. With the capacitor 78, phase compensation is performed between the first control current I13 and the second control current I23, and thus differential output currents OUT+ and OUT− output from the OTA circuit 50B are stabilized.

Also, the gate capacitance 78 may be a variable capacitor array having a capacitance value that changes depending on a control signal Vy. Thereby, it is possible to change the cut-off frequency of the filter.

Figure 17:
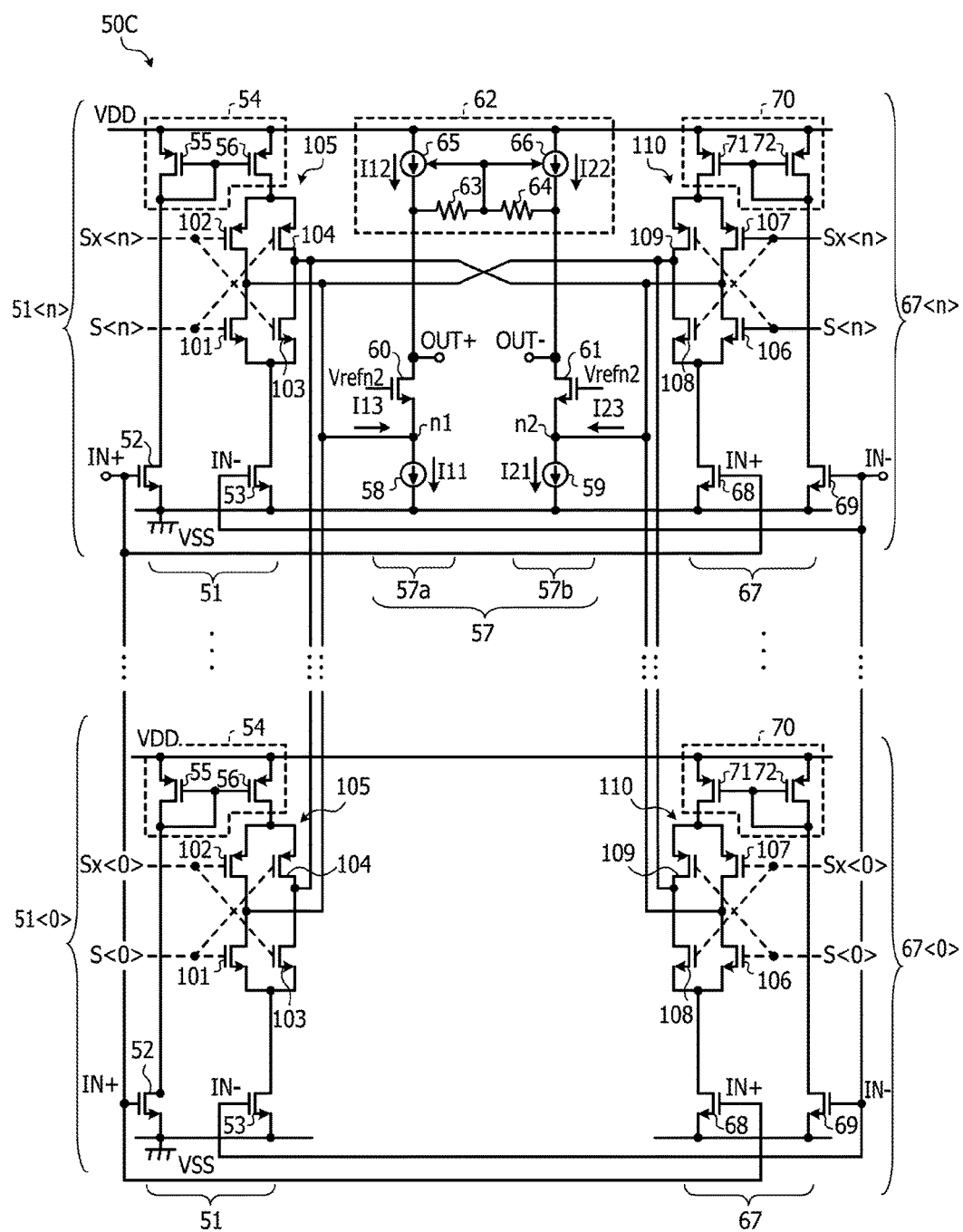
FIG. 17 is a diagram illustrating an example of the configuration of an OTA circuit having a changeable transconductance.

FIG. 17 is a diagram illustrating an example of the configuration of an OTA circuit having a changeable transconductance. An OTA circuit 50C includes (n+1) input stages 51<0> to 51<n>, (n+1) input stages 67<0> to 67<n>, and one output stage 57. Reference sign n is a natural number. Further, the OTA circuit 50C includes a first selection unit including (n+1) first selection circuits 105 and a second selection unit including (n+1) second selection circuits 110.

The first selection unit selects an input stage that supplies a first control current I13 to a second cascode circuit 57$b$ as a second control current I23 out of a plurality of first input stages 51 in accordance with (n+1) first select signals S<i> and (n+1) second select signals Sx<i>. The second selection unit selects an input stage that supplies a second control current I23 to a first cascode circuit 57$a$ as a first control current I13 out of a plurality of second input stages 67 in accordance with (n+1) first select signals S<i> and (n+1) second select signals Sx<i>. In this regard, i denotes an integer from 0 to n. Also, the second select signal Sx<i> refers to an inverted signal having inverted logic from the first select signal S<i>.

With such a configuration, it is possible to change Gm of the OTA circuit 50C from a negative value to a positive value.

Specifically, the first selection circuit 105 and the second selection circuit 110 swaps the output of the input stage 51 and the output of the input stage 67.

The first selection circuit 105 is connected between the drain of the transistor 56 and the drain of the transistor 53. The first selection circuit 105 has a configuration in which a series circuit of an NMOS 101 and a PMOS 102 is connected in parallel with a series circuit of an NMOS 103 and a PMOS 104. A connection point between the drain of the NMOS 101 and the drain of the PMOS 102 is connected to a first node n1, and a connection point between the drain of the NMOS 103 and the drain of the PMOS 104 is connected to a second node n2.

The second selection circuit 110 is connected between the drain of the transistor 68 and the drain of the transistor 71. The second selection circuit 110 has a configuration in which a series circuit of an NMOS 106 and a PMOS 107 is connected in parallel with a series circuit of an NMOS 108 and a PMOS 109. A connection point between the drain of the NMOS 106 and the drain of the PMOS 107 is connected to the second node n2, and a connection point between the drain of the NMOS 108 and the drain of the PMOS 109 is connected to the first node n1.

The first select signal S<i> and the second select signal Sx<i> are input to the first selection circuit 105 of the first input stage 51<i> and the second selection circuit 110 of the second input stage 67<i> respectively. The first select signal S<i> is input to the gates of the NMOSs 101 and 106 and the PMOSs 104 and 109. The second select signal Sx<i> is input to the gates of the NMOSs 103 and 108 and the PMOSs 102 and 107.

By setting the first select signal S<i> and the second select signal Sx<i> individually to a high level or a low level, it is possible to adjust the current values of the first control current I13 and the second control current I23. Accordingly, it is possible to change the Gm of the OTA circuit 50C from a negative value to a positive value.

Figure 18:
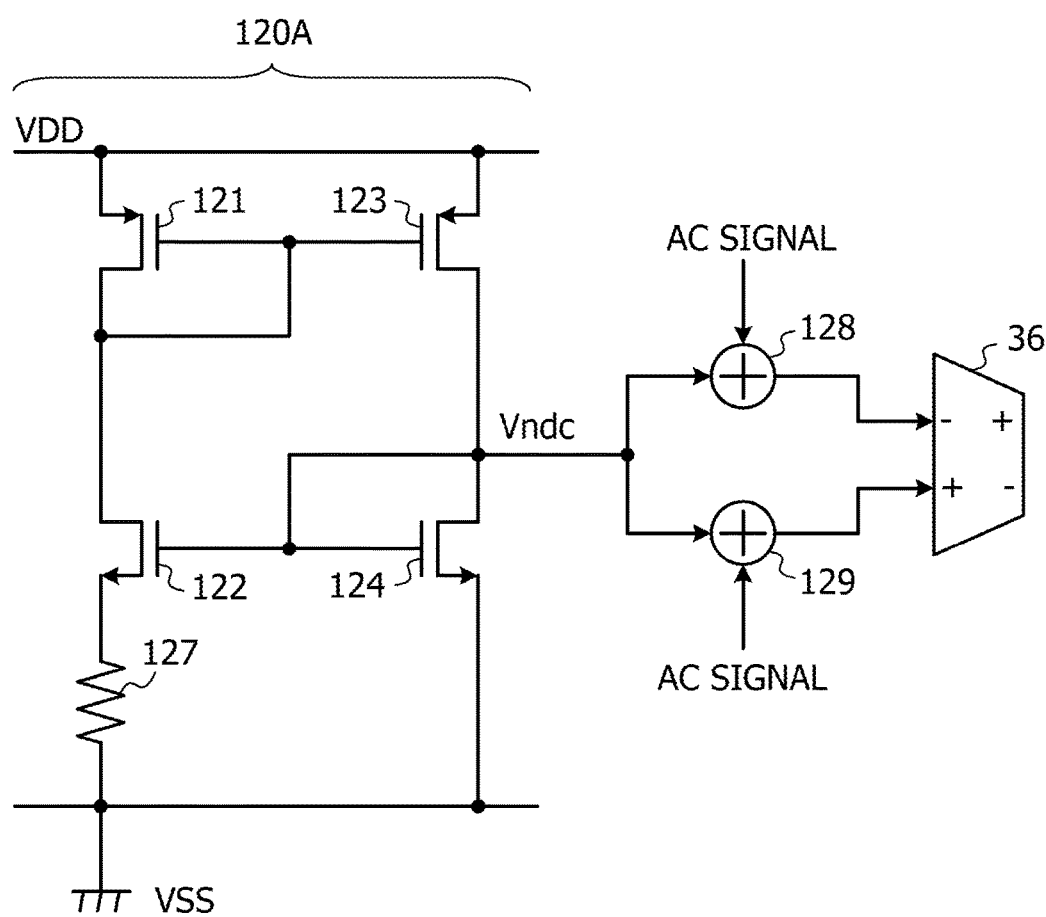
FIG. 18 is a diagram illustrating an example of a first configuration of a Gm compensation bias circuit used in an OTA circuit.

FIG. 18 is a diagram illustrating an example of a first configuration of a Gm compensation bias circuit used in an OTA circuit. The Gm compensation bias circuit 120A is an example of a Gm compensation circuit and supplies a direct current voltage component Vndc, which is a center voltage of the differential input voltage IN+ and IN− of an alternating current wave input to the OTA circuit 36. The direct current voltage component Vndc is supplied as the above-described input voltage Vrefn1. Also, the direct current voltage component Vndc and the alternating current signal are added by adders 128 and 129 so that the differential input voltage IN+ and IN− is generated. The adders 128 and 129 are, for example, high pass filters formed by a resistor and a capacitor.

The Gm compensation circuit is connected to an amplification circuit including a MOS and a load resistor connected in series and gives a bias to the gate of the MOS. The Gm compensation circuit is a bias circuit for generating a gate voltage that compensates for that the Gm of the MOS is inversely proportional to the resistance value of the load resistor.

The Gm compensation bias circuit 120A includes a first PMOS 121, a second PMOS 123, a first NMOS 122, and a second NMOS 124. The first PMOS 121 has a source connected to the power source potential VDD, a gate, and a drain connected to the gate. The first NMOS 122 has a drain connected to the drain of the first PMOS, a gate, and a source connected to the reference potential VSS via the resistor 127. The second PMOS 123 has a source connected to the power source potential VDD, a gate connected to the first PMOS 121, and a drain. The second NMOS 124 has a drain connected to the drain of the second PMOS, a gate connected to the drain, and a source connected to the reference potential VSS. A direct current voltage component Vndc is output from the connection node between the drain of the second PMOS 123 and the drain of the second NMOS 124.

The Gm compensation bias circuit 120A adjusts the Gms of the first pair of transistors 52 and 53 and the second pair of transistors 68 and 69 by a control signal. For example, the resistor 127 may be a variable resistor having a resistance value that changes in accordance with the control voltage, which is an example of the control signal. Thereby, it is possible to change the Gm of the Gm compensation bias circuit 120A, and thus it is possible to adjust the cut-off frequency of the filter.

Figure 19:
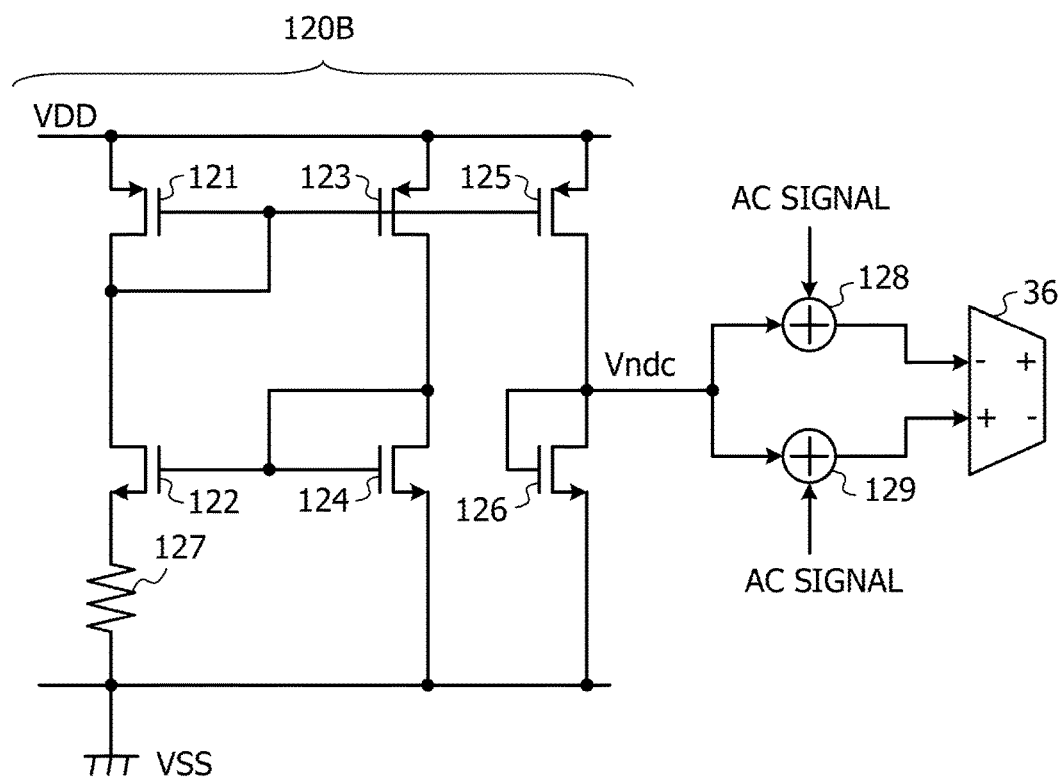
FIG. 19 is a diagram illustrating an example of a second configuration of a Gm compensation bias circuit used in an OTA circuit.

FIG. 19 is a diagram illustrating an example of a second configuration of a Gm compensation bias circuit used in an OTA circuit. A Gm compensation bias circuit 120B is an example of the Gm compensation circuit and includes a third PMOS 125 and a third NMOS 126 in comparison with the Gm compensation bias circuit 120A (refer to FIG. 18).

The third PMOS 125 has a source connected to the power source potential VDD, a gate connected to the first PMOS 121, and a drain. The third NMOS 126 has a source connected to the reference potential VSS, a drain connected to the third PMOS 125, and a gate connected to the drain. The direct current voltage component Vndc is output from the connection node between the drain of the third PMOS 125 and the drain of the third NMOS 126.

The Gm compensation bias circuit 120B adjusts the Gms of the first pair of transistors 52 and 53 and the second pair of transistors 68 and 69 by a control signal. For example, at least one of the third PMOS 125 and the third NMOS 126 may have a transistor array configuration, and the gate voltage of the unit transistor in the array may be controlled by a control signal so that a configuration in which the current density of the third NMOS 126 is changeable may be formed. Thereby, it is possible to make the OTA Gm value variable, and thus to adjust the cut-off frequency of the filter.

As described above, descriptions have been given of an OTA circuit and a filter by the embodiments. However, the present disclosure is not limited to the embodiments described above. It is possible to combine a part of or all of the other embodiments, and to make various variations and improvements, such as replacement, or the like within the scope of the present disclosure.

For example, in each of the OTA circuits, the NMOSs and PMOSs may be replaced with each other, and the power source potential VDD and the reference potential VSS may be replaced with each other.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier circuit comprising:
    a first input stage that includes a first pair of transistors having sources coupled to a reference potential and converts a differential input voltage input to gates of the first pair of transistors into a first control current;
    a second input stage that includes a second pair of transistors having sources coupled to the reference potential and converts the differential input voltage input to gates of the second pair of transistors into a second control current;
    a first output circuit that generates one output current out of the differential output currents in accordance with the first control current; and
    a second output circuit that generates the other output current out of the differential output currents in accordance with the second control current,
    the first output circuit includes a first current source coupled to a first node supplied with the first control current, a first transistor having a source coupled to the first node, and a second current source coupled to a drain of the first transistor, and outputs one of the output currents from the drain of the first transistor, the second output circuit includes a third current source coupled to a second node supplied with the second control current, a second transistor having a source coupled to the second node, and a fourth current source coupled to a drain of the second transistor, and outputs the other of the output currents from the drain of the second transistor.

2. The amplifier circuit according to claim 1, wherein the first current source includes a third transistor having a source coupled to the reference potential and a drain coupled to the first node, and the third current source includes a fourth transistor having a source coupled to the reference potential and a drain coupled to the second node.

3. The amplifier circuit according to claim 2, further comprising: a voltage divider circuit that divides the differential input voltage and supplies the divided voltages to a gate of the third transistor and a gate of the fourth transistor.

4. The amplifier circuit according to claim 1, further comprising: a capacitor coupled between the first node and the second node.

5. The amplifier circuit according to claim 4, wherein the capacitor is a variable capacitor array having a capacitance value to be changed by a control signal.

6. The amplifier circuit according to claim 1, wherein the second current source has a cascode configuration including a plurality of transistors coupled, and the fourth current source has a cascode configuration including a plurality of transistors coupled.

7. The amplifier circuit according to claim 1, wherein the first pair of transistors is a pair of a fifth transistor having a gate to which one of the differential input voltage is input and a sixth transistor having a gate to which the other of the differential input voltage is input, and the first input stage generates the first control current by subtracting a drain current of the sixth transistor from a drain current of the fifth transistor, and the second pair of transistors is a pair of a seventh transistor having a gate to which the one of the input voltages is input and an eighth transistor having a gate to which the other of the input voltages is input, and the second input stage generates the second control current by subtracting a drain current of the seventh transistor from a drain current of the eighth transistor.

8. The amplifier circuit according to claim 1, further comprising: a plurality of the first input stages and a plurality of the second input stages, a first selection unit that selects an input stage for supplying the first control current to the second output circuit as the second control current out of the plurality of the first input stages, and a second selection unit that selects an input stage for supplying the second control current to the first output circuit as the first control current out of the plurality of the second input stages.

9. The amplifier circuit according to claim 1, wherein a Gm compensation circuit for supplying a direct current voltage being a center voltage of the differential input voltage is to be coupled.

10. The amplifier circuit according to claim 9, wherein the Gm compensation circuit adjusts Gm of the first pair of transistors and the second pair of transistors by a control signal.

11. A filter comprising:
a first amplifier circuit;
an operational amplifier having an input unit coupled to an output stage of the first amplifier circuit;
a second amplifier circuit having an input stage coupled to an output unit of the operational amplifier and an output stage coupled to an input unit of the operational amplifier;
a pair of capacitors supplied with differential output currents output from the output stage of the first amplifier circuit and the output stage of the second amplifier circuit and coupled between the input unit of the operational amplifier and the output unit of the operational amplifier, wherein the first amplifier circuit and the second amplifier circuit individually include a first input stage that includes a first pair of transistors having a source coupled to a reference potential and converts the differential input voltage input to gates of the first pair of transistors into a first control current, a second input stage that includes a second pair of transistors having a source coupled to the reference potential and converts the differential input voltage input to gates of the second pair of transistors into a second control current, a first output circuit that generates one output current out of the differential output currents in accordance with the first control current, and a second output circuit that generates the other output current out of the differential output currents in accordance with the second control current,
the operational amplifier includes a third pair of transistors having a source coupled to a power source potential and being the input unit, and a fourth pair of transistors having a source coupled to the reference potential, wherein one of the differential outputs is output from a connection point between a drain of one of the third pair of transistors and a drain of one of the fourth pair of transistors, and the other of the differential outputs is output from a connection point between a drain of the other of the third pair of transistors and a drain of the other of the fourth pair of transistors.

12. The filter according to claim 11, further comprising:
a gate capacitor coupled between gates of the third pair of transistors.

13. The filter according to claim 12, wherein the gate capacitor is a variable capacitor array having a capacitance value to be changed by a control signal.

14. The filter according to claim 11, wherein at least one of the third pair of transistors and the fourth pair of transistor has a cascode configuration.

\* \* \* \* \*